(12) United States Patent
Shimoyama et al.

(10) Patent No.: US 7,963,513 B2
(45) Date of Patent: Jun. 21, 2011

(54) MOUNTING DEVICE

(75) Inventors: Hiroshi Shimoyama, Nirasaki (JP);
Kazuya Yano, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 495 days.

(21) Appl. No.: 12/024,556

(22) Filed: Feb. 1, 2008

(65) Prior Publication Data
US 2008/0187420 A1    Aug. 7, 2008

(30) Foreign Application Priority Data

Feb. 2, 2007    (JP) .................................. 2007-024912

(51) Int. Cl.
*B23Q 1/64* (2006.01)

(52) U.S. Cl. ......................................... 269/56; 269/900

(58) Field of Classification Search .................... 269/29, 269/266, 35, 55, 60, 73, 71, 45, 56, 58, 61, 269/309, 289 R, 291; 441/6; 414/222.04, 414/222.13, 226.04; 52/7; 297/344.12, 344.22; 33/1 M; 108/144, 144.11, 106, 108, 147.19; 248/669

See application file for complete search history.

(56) References Cited

U.S. PATENT DOCUMENTS

| | | | | |
|---|---|---|---|---|
| 2,517,431 A | * | 8/1950 | Hildebrand et al. | ............. 269/25 |
| 6,367,788 B1 | * | 4/2002 | Babchuk | ......................... 269/45 |
| 7,057,365 B2 | | 6/2006 | Kishida | |
| 7,364,124 B2 | * | 4/2008 | Yuasa et al. | ................ 248/125.8 |

FOREIGN PATENT DOCUMENTS

| | | |
|---|---|---|
| CN | 1737591 A | 2/2006 |
| CN | 2808723 Y | 8/2006 |

* cited by examiner

*Primary Examiner* — Lee D Wilson
*Assistant Examiner* — Jamal Daniel
(74) *Attorney, Agent, or Firm* — Oblon, Spivak, McClelland, Maier & Neustadt, L.L.P.

(57) ABSTRACT

A mounting device provided on a horizontally movable stage mechanism, includes a mounting table for mounting thereon a target object, a cylindrical elevation body, having a diameter smaller than a diameter of the mounting table, for supporting the mounting table, a plurality of elevation guide rails provided on an outer peripheral surface of the elevation body so as to be spaced from each other at substantially regular intervals in a circumferential direction, and a plurality of support members each having a vertical plate to which engaging bodies engaged with the elevation guide rails are fixed. Further, a plurality of reinforcing parts are vertically provided on the outer peripheral surface of the elevation body so as to be spaced from each other at substantially regular intervals in the circumferential direction.

9 Claims, 6 Drawing Sheets

MOUNTING DEVICE

FIELD OF THE INVENTION

The present invention relates to a mounting device for mounting thereon a target object so that the target object can be lifted up and down when a predetermined process is performed thereon; and, more particularly, to a mounting device can be moved at high speed in a horizontal direction by a stage mechanism.

BACKGROUND OF THE INVENTION

Such a mounting device is conventionally provided in a processing apparatus for performing a predetermined process on a target object (e.g., a semiconductor wafer). A representative processing apparatus includes an inspection apparatus such as a probe apparatus or the like. As illustrated in, e.g., FIG. 6A, the inspection apparatus includes: a mounting device 1 for mounting thereon a semiconductor wafer W so that the semiconductor wafer W can be lifted up and down; a stage mechanism 2 on which the mounting device 1 is provided, for moving the mounting device 1 in a horizontal (X and Y) direction; a probe card 3 disposed above the mounting device 1; and an alignment mechanism (not shown) for performing alignment between a plurality of probes 3A of the probe card 3 and electrode pads of the semiconductor wafer W. Further, the inspection apparatus is constructed to inspect the semiconductor wafer W by making electrical contact between the semiconductor wafer W and the probes 3 after performing the alignment between the probes 3A and the electrode pads of the semiconductor wafer W by the alignment mechanism.

As shown in FIG. 6A, the stage mechanism 2 includes an X stage 2A, a Y stage 2B and a fixed stage 2C. The X stage 2A and the Y stage 2B move the mounting device 1 in the X and Y directions by respective driving units (not shown). An X guide mechanism 2D is interposed between the X stage 2A and the Y stage 2B, so that the X stage 2A moves on the Y stage 2B in the X direction along the X guide mechanism 2D. A Y guide mechanism 2E is interposed between the Y stage 2B and the fixed stage 2C, so that the Y stage 2B moves on the fixed stage 2C in the Y direction along the Y guide mechanism 2E.

Further, as depicted in FIGS. 6A and 6B, the mounting device 1 includes: a mounting table 1A for mounting thereon a semiconductor wafer W; an elevation body 1B connected to a central portion of a bottom surface of the mounting table 1A; and a pair of right and left support members 1C supporting the elevation body 1B at right and left sides thereof so that the elevation body 1B can be lifted up and down. The mounting device 1 vertically moves the elevation body 1B and the mounting table 1A by an elevation driving mechanism installed inside the elevation body 1B. The elevation body 1B is a housing having a top portion of square shape, and accommodates therein the elevation driving mechanism. The elevation body 1B has a size such that the four corners thereof are disposed near the periphery of the mounting table 1A.

As illustrated in FIG. 6B, each of the right and left support members 1C is an angle bracket having a vertical plate 1D and a horizontal plate 1E perpendicular to the vertical plate 1D at an approximately middle portion thereof, and is fixed on the X stage 2A by bolts (not shown) fitted into the X stage 2A through a plurality of bolt holes 1F of the horizontal plate 1E. A plurality of brackets 1G spaced from each other in a width direction are provided between the vertical plate 1D and the horizontal plate 1E. The vertical plates 1D are extended to penetrate through a hole of the X stage 2A, and lower portions of the vertical plates 1D are connected with each other below the X stage 2A by a connecting plate 1H. A motor 1I forming an elevation driving mechanism is installed at a central portion of the connecting plate 1H. The elevation driving mechanism includes: the motor 1I; a screw (not shown) coupled to the motor 1I; and a nut member (not shown) engaged with the screw and fixed to the elevation body 1B. The vertical plate 1D is formed to have a width substantially same as that of a surface of the elevation body 1B facing the vertical plate 1D.

Two elevation guide rails 1J are fixed to the vertical plate 1D of each of the support members 1C while being spaced from each other at a predetermined interval in the width direction. Each of the elevation guide rails 1J is engaged with vertical engaging bodies 1K fixed to the elevation body 1B.

However, the conventional mounting device 1 is disadvantageous in that a speed of movement by the stage mechanism 2 is restricted due to a heavy weight of the elevation body 1B and the support members 1C, and also in that time is required until the mounting table 1 stops its movement and becomes stabilized due to poor vibration characteristics and a remaining vibration after the movement. Moreover, a weight balance is poor because a weight distribution in the X direction is different from that in the Y direction. Further, the engaging bodies 1K are attached to the elevation body 1B and extended vertically while being spaced from each other at predetermined intervals, so that a rigidity of the elevation body 1B with respect to a probe pressure applied to the mounting table 1A from the probe 3A is not high enough considering its weight. Besides, since the elevation body 1B is supported by the support members 1C only at right and left sides thereof, the rigidity is not even in all directions thereof. Accordingly, an inclination of the mounting table 11 varies depending on the location to which the probe pressure is applied.

SUMMARY OF THE INVENTION

In view of the above, the present invention provides a mounting device having a reduced weight, an increased rigidity and a symmetrical weight balance and capable of moving at high speed and having improved inspection reliability.

In accordance with the present invention, there is provided a mounting device provided on a horizontally movable stage mechanism, including: a mounting table for mounting thereon a target object; a cylindrical elevation body, having a diameter smaller than a diameter of the mounting table, for supporting the mounting table; a plurality of elevation guide rails provided on an outer peripheral surface of the elevation body so as to be spaced from each other at substantially regular intervals in a circumferential direction; and a plurality of support members each having a vertical plate to which engaging bodies engaged with the elevation guide rails are fixed.

Further, a plurality of reinforcing parts are vertically provided on the outer peripheral surface of the elevation body so as to be spaced from each other at substantially regular intervals in the circumferential direction.

It is preferred that the reinforcing parts are disposed in the middle of the elevation guide rails.

Further, protrusions supporting the mounting table are provided at upper portions of the reinforcing parts.

Furthermore, the elevation guide rails and the reinforcing parts are provided at three locations on the outer peripheral surface of the elevation body, respectively.

In accordance with the present invention, it is possible to provide a mounting device having a reduced weight, an increased rigidity and a symmetrical weight balance and capable of moving at high speed and having improved inspection reliability.

BRIEF DESCRIPTION OF THE DRAWINGS

The objects and features of the present invention will become apparent from the following description of embodiments, given in conjunction with the accompanying drawings, in which:

FIGS. 4A and 4B show a transfer mechanism of a semiconductor wafer which is used in the mounting device of FIG. 1, wherein FIG. 4A is a cross sectional view of principal parts, showing a state before the semiconductor is received, and FIG. 4B is a cross sectional view of principal parts showing a state when the semiconductor is received;

FIGS. 5A and 5B illustrate a transfer mechanism of a semiconductor wafer which is used in a conventional mounting device, wherein FIG. 5A is a cross sectional view of principal parts, showing a state before the semiconductor is received, and FIG. 5B is a cross sectional view of the principal parts, showing a state when the semiconductor wafer is received; and FIGS. 6A and 6B describe principal parts of an inspection device having the conventional mounting device, wherein FIG. 6A shows a side view thereof, and FIG. 6B provides a top view of the principal parts.

DETAILED DESCRIPTION OF THE EMBODIMENT

The embodiment of the present invention will now be described with reference to FIGS. 1 and 2 which form a part hereof.

Figure 1:
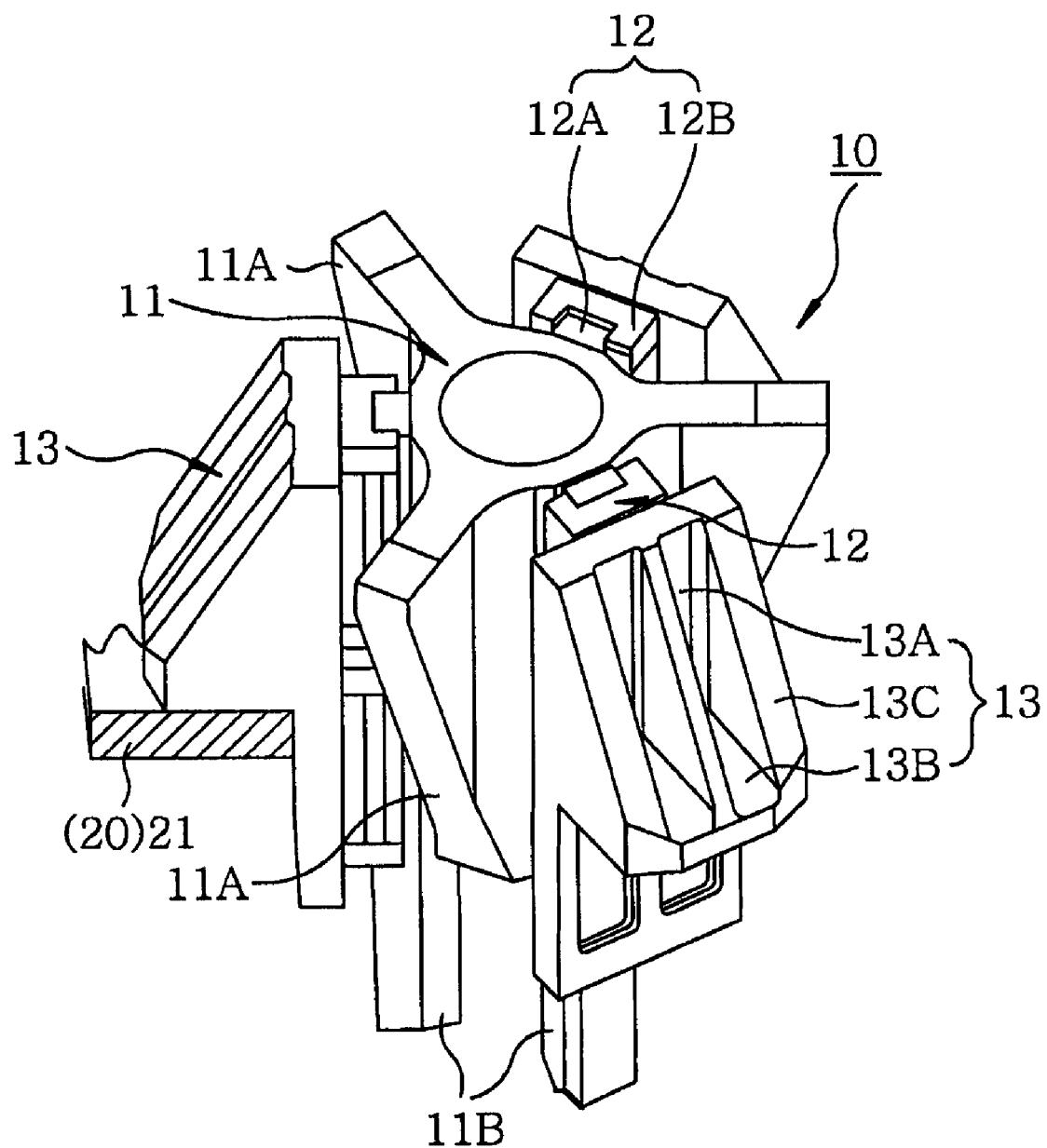
FIG. 1 is a perspective view showing a mounting device in accordance with an embodiment of the present invention.
Figure 2:
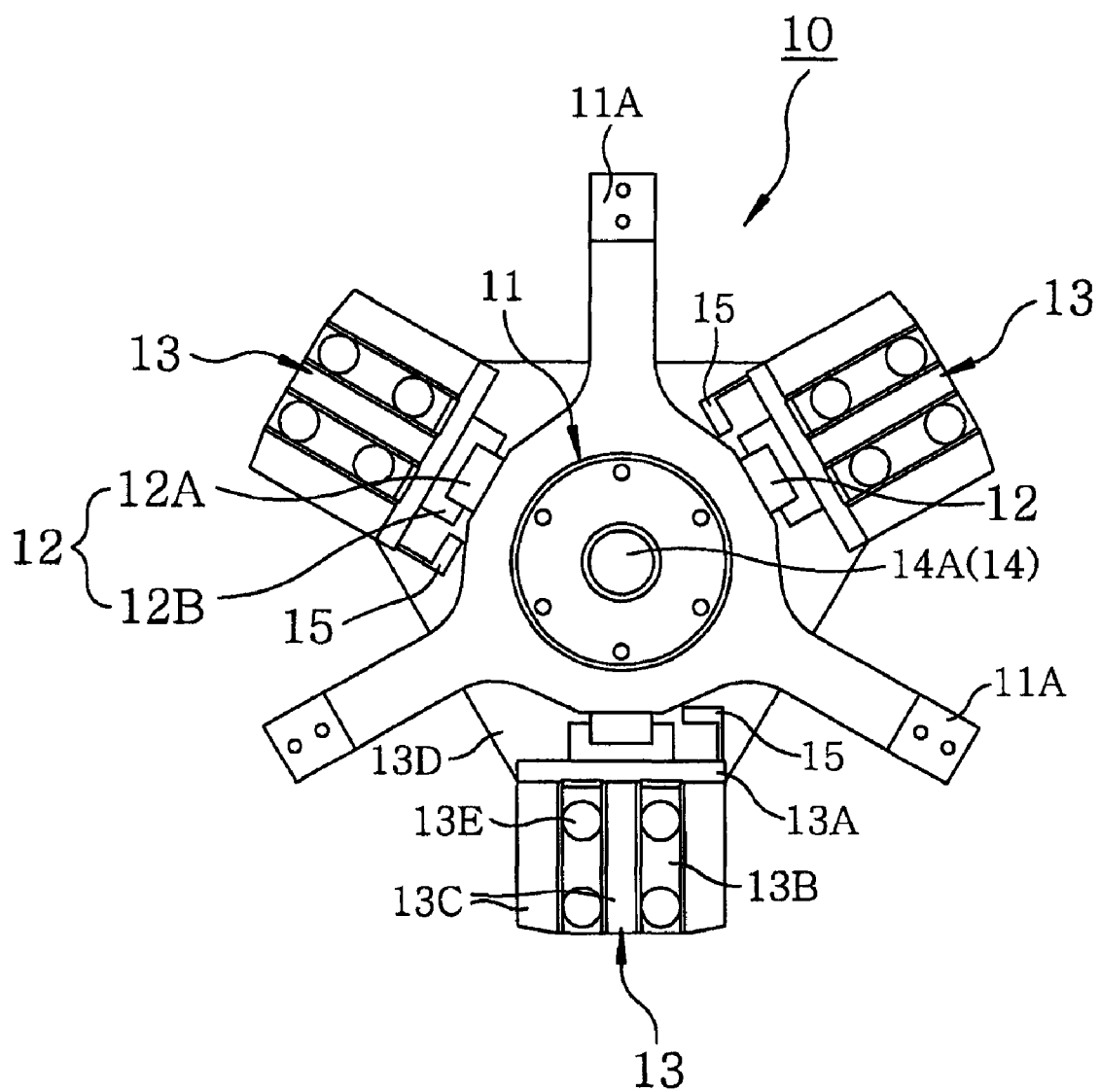
FIG. 2 describes a top view illustrating principal parts of the mounting device shown in FIG. 1.

As illustrated in FIGS. 1 and 2, the mounting device 10 of this embodiment includes: an elevation body 11 connected to a central portion of a bottom surface of a mounting table (not shown); three elevation guide mechanisms 12 provided on an outer peripheral surface of the elevation body 11 while being spaced from each other at regular intervals in a circumferential direction; and support members 13 for supporting the elevation body 11 at three locations so that the elevation body 11 can be lifted up and down by the elevation guide mechanisms 12. The three support members 13 are disposed on the outer peripheral surface of the elevation body 11 while being spaced from each other at 120° intervals in the circumferential direction. Further, the support members 13 have a uniform weight distribution along the circumferential direction of the elevation body 11.

The elevation body 11 is formed in a cylindrical shape having a diameter smaller than an outer diameter of the mounting table. As depicted in FIGS. 1 and 2, reinforcing parts 11A are vertically provided at three locations on the outer peripheral surface of the elevation body 11 while being spaced from each other at 120° intervals in the circumferential direction. Upper portions of the reinforcing parts 11A are protruded radially from the elevation body 11. Each of the reinforcing parts 11A is formed in a substantially right-angled triangle shape having a width gradually increasing outwardly from a lower portion of the elevation body 11 toward an upper portion thereof.

Figure 3:
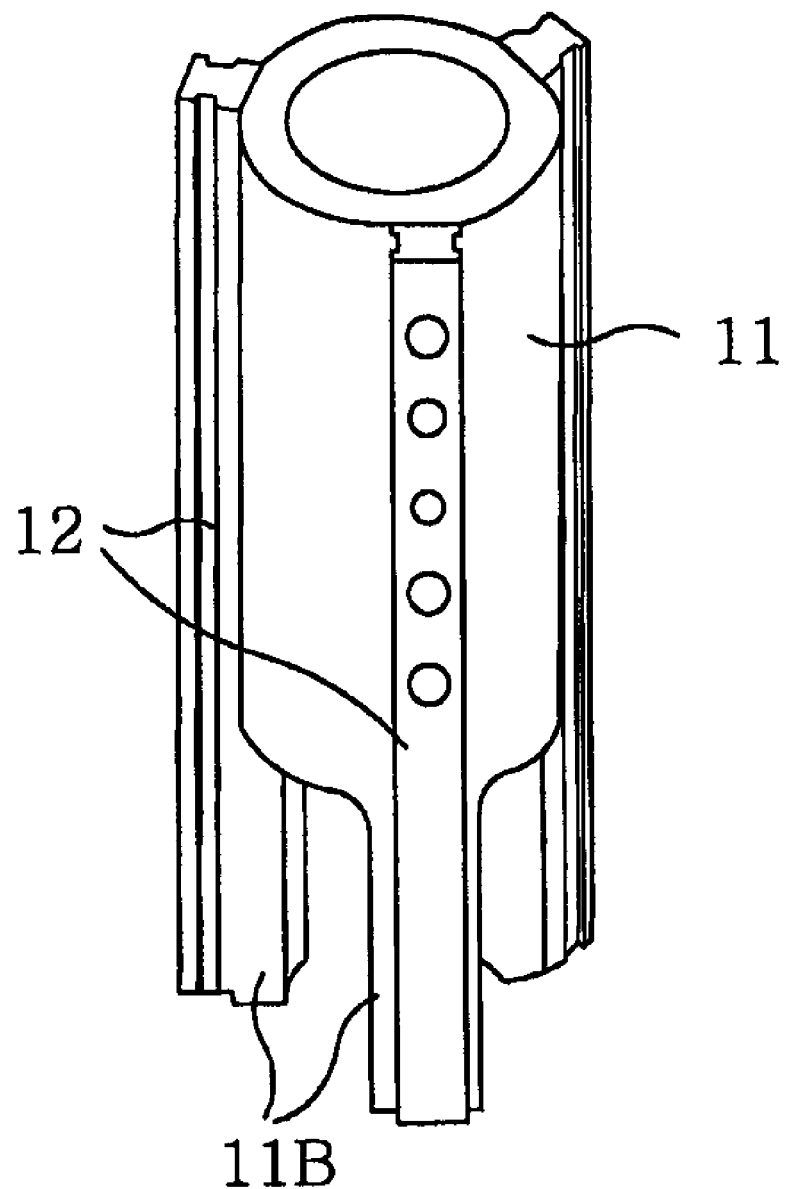
FIG. 3 provides a perspective view depicting principal parts of a modification of the mounting device shown in FIG. 1.

Further, upper surfaces of the reinforcing parts 11A correspond to an upper surface of the elevation body 11. The upper surfaces of the radially arranged three reinforcing parts 11A extend to an outer edge portion of the mounting table, thus supporting a bottom surface of the mounting table. As a consequence, the reinforcing parts 11A can deal with a large-sized semiconductor wafer by expanding a supporting area of the mounting table with the use of the protrusions radially extending from the elevation body 11 having a small diameter. In case of a small-sized semiconductor wafer, the reinforcing parts 11A may be omitted, and the mounting table is supported by the cylindrical elevation body 11, as depicted in FIG. 3.

Accordingly, the elevation body 11 is scaled down compared to a conventional square-shaped elevation body, and a weight thereof is reduced by that amount. Besides, as similarly to support members 13, the reinforcing parts 11A are spaced from each other at 120° intervals in the circumferential direction. As a result, as in the case of the support members 13, the reinforcing parts 11A have a uniform weight distribution along the circumferential direction of the elevation body 11.

As can be seen from FIGS. 1 and 2, each of the elevation guide mechanisms 12 has an elevation guide rail 12A vertically fixed to the outer peripheral surface of the elevation body 11 and an engaging body 12B of an approximately "C" shape, which is vertically fixed to a vertical plate 13A of the support member 13. As illustrated in FIG. 1, the elevation body 11 has lower protruding portions 11B along which the elevation guide rails 12A fixed to the elevation body 11 are extended respectively.

Furthermore, the elevation body 11 has therein a motor (not shown) forming an elevation driving mechanism 14 and a screw 14A, as shown in FIG. 2. The screw 14A is engaged with a nut member fixed to the inner side of the elevation body 11. Therefore, when the motor is driven, the elevation body 11 is lifted up and down with respect to an X stage 21 through the screw 14A and the nut member. The motor is fixed to a central portion of a connecting plate of the support members 13 which will be described later.

As described above, the elevation guide rails 12A as well as the reinforcing parts 11A therebetween are provided at three locations on the outer peripheral surface of the elevation body 11 while being spaced from each other at 120° intervals. Therefore, the vertical rigidity of the elevation body 11 is enhanced by 120° intervals in the circumferential direction thereof. Accordingly, even if the probe pressure is applied to any part of the outer peripheral portion of the mounting table, the variation in the inclination of the mounting table due to the probe pressure is suppressed, thereby increasing reliability of the inspection.

Moreover, as shown in FIGS. 1 and 2, the support member 13 is an angle bracket having the vertical plate 13A, a horizontal plate 13B horizontally extending from an approximately middle portion of the vertical plate 13A, and brackets 13C reinforcing the vertical plate 13A and the horizontal plate 13B. The support members 13 are fixedly mounted on the X stage 21 through the respective horizontal plates 13B. The brackets 13C are formed at three locations on the vertical plate 13A and the horizontal plate 13B while being spaced from each other at regular intervals in a width direction thereof. The engaging body 12B of the elevation guide mechanism 12 is vertically attached to a middle portion in the width direction of the corresponding vertical plate 13A. As illustrated in FIG. 2, the three support members 13 are connected as a unit by the connecting plate 13D at the bottom portion of the vertical plate 13A. The connecting plate 13D is positioned under the X stage 21 (not shown). The motor is provided at a central portion of the connecting plate 13D, and the screw 14A is coupled to the motor, as can be seen from FIG. 2. The screw 14A is arranged so that an axis thereof coincides with an axis of the elevation body 11. In FIG. 2, reference numeral 13E indicates bolt holes for fixing the support members 13 to the X stage 21.

Figure 4A:
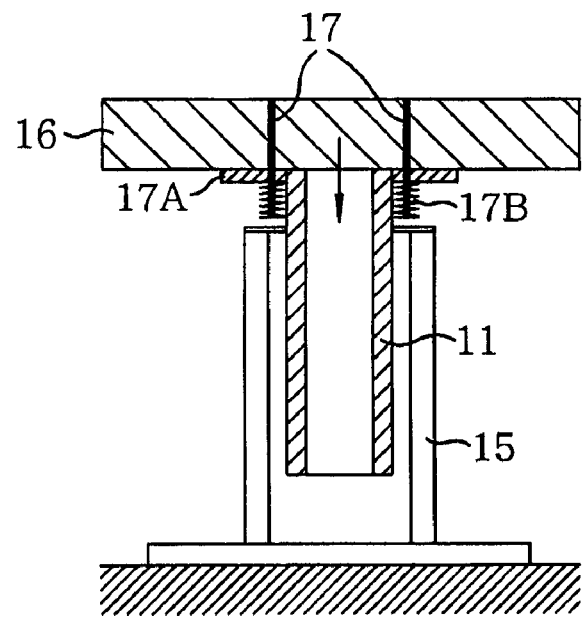
Figure 4B:
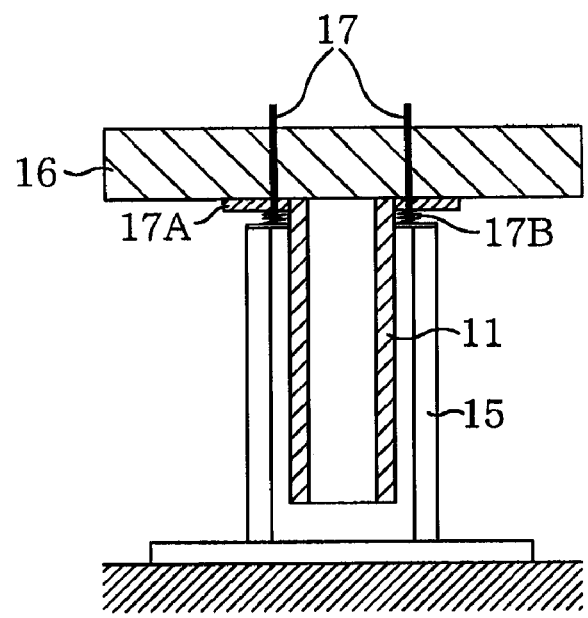

Moreover, as depicted in FIG. 2, one surfaces of the vertical plates 13A of the three support members 13 are provided with upthrust members 15 that lift up elevation pins provided in the mounting table when the semiconductor wafer is transferred on the mounting table. FIGS. 4A and 4B shows a relationship between the upthrust members 15 and the elevation pins. In FIGS. 4A and 4B, the upthrust members 15 are depicted as being independent from the surfaces of the vertical plates 13A.

As schematically illustrated in FIGS. 4A and 4B, the mounting table 16 is fixedly coupled to an upper portion of the elevation body 11. Holes for allowing elevation pins 17 to penetrate therethrough are formed at three locations on a same circumference near a center of the mounting table 16, the holes being spaced from each other at 120° intervals in the circumferential direction. In this embodiment, an outer diameter of the elevation body 11 is considerably smaller than that of the mounting table 16, so that all the elevation pins 17 provided at three locations are disposed at outside of the elevation body 11. Further, a ring 17A having the holes for allowing the three elevation pins 17 to penetrate therethrough is attached to the bottom surface of the mounting table so as to surround the elevation body 11. Flanges are formed at lower portions of the elevation pins 17, and springs 17B are installed between the flanges and the ring 17A. Moreover, the upthrust members 15 are disposed directly under the elevation pins 17. Accordingly, when the elevation body 11 and the mounting table 16 are lowered, the elevation pins 17 are lifted up from the mounting table 16 by the upthrust members 15 and protrude from a mounting surface of the mounting table 16. As described above, the elevation pins 17 and a supporting mechanism thereof require a small number of components, and can be manufactured at a low cost.

The elevation pins 17 are separated upward from the upthrust members 15 except when the semiconductor wafer is transferred, as depicted in FIG. 4A. When the semiconductor wafer W is transferred, the elevation body 11 is lowered as shown in FIG. 4B and, thus, the flanges of the elevation pins 17 are brought into contact with the upthrust members 15. When the elevation body 11 is further lowered, the elevation pins 17 are lifted up by the upthrust members 15 against elastic force of the springs 17A and protrude from the mounting surface of the mounting table 16, thereby preparing to transfer the semiconductor wafer. Thereafter, when the elevation body 11 is lifted up, the elevation pins 17 return to the original state thereof by the elastic force of the springs 17A. Accordingly, the semiconductor wafer is mounted on the mounting table 16.

Figure 5A:
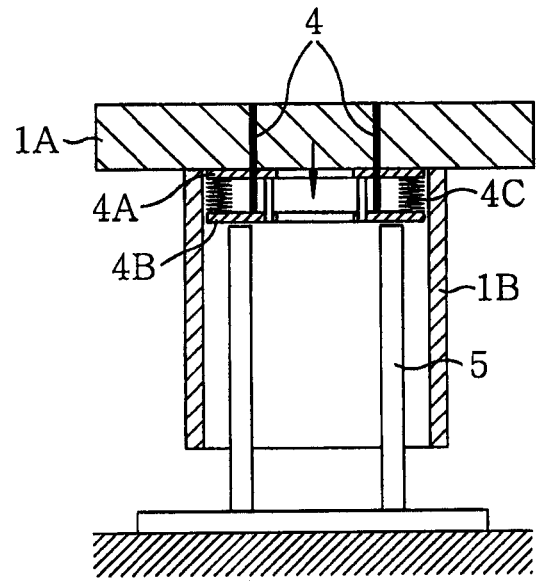
Figure 5B:
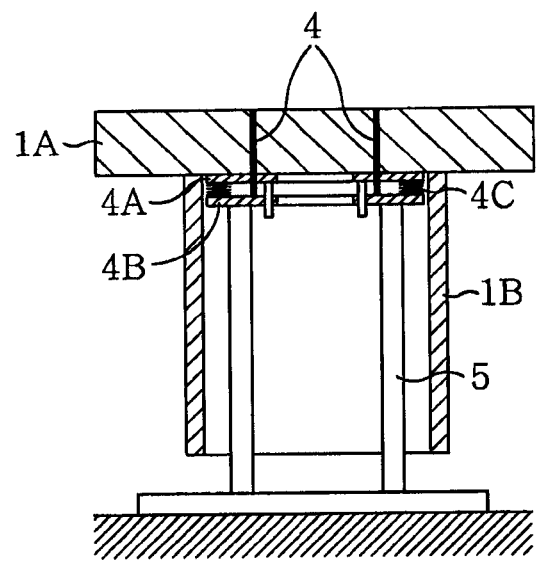
Figure 6A:
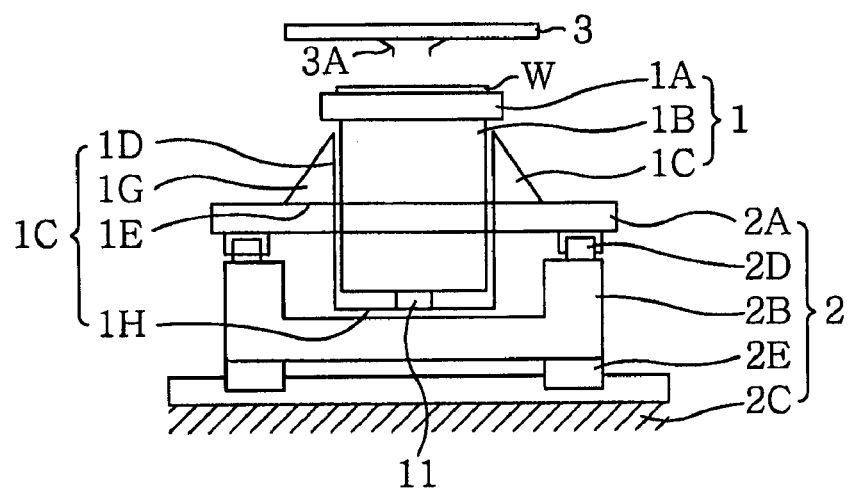
Figure 6B:
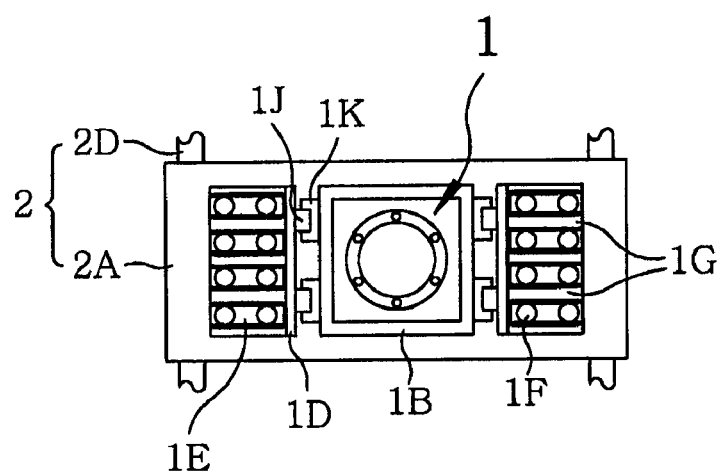

Meanwhile, as shown in FIGS. 5A and 5B, elevation pins 4 of a conventional mounting device penetrate a mounting table 1A and a ring 4A provided on a bottom surface of the mounting table 1A, and lower portions of the elevation pins 4 are fixed to a fixed ring 4B disposed under the ring 4A. A plurality of springs 4C are provided between the ring 4A and the fixed ring 4B while being spaced from each other at regular intervals in a circumferential direction. The ring 4A and the fixed ring 4B are provided at inside of an elevation body 1B. Further, as can be seen from FIGS. 5A and 5B, upthrust members 5 are disposed directly under the fixed ring 4B. Thus, when the elevation body 1B is lowered, the elevation pins 4 protrude from a mounting surface of the mounting table 1A. Since the conventional elevation pins 4 are disposed at inside of the elevation body 1B, it is difficult to adjust positions of the upthrust members 5 with respect to the support mechanism of the elevation pins 4, and further difficult to adjust elevation positions of the elevation pins 4. Besides, the ring 4A, the fixed ring 4B, and the springs 4C are required so that the number of components are increased, thereby increasing a manufacturing cost.

As in the conventional case, the mounting device 10 of this embodiment moves in the X and Y directions through the stage mechanism 20 when alignment between a semiconductor wafer on the mounting table and a plurality of probes of a probe card is performed or when the semiconductor wafer is tested after the alignment. Here, the mounting device 10 has a light weight compared to the conventional one, so that the movement speed can be increased. Moreover, remaining vibration of the mounting device 10 after the high-speed movement is small and, hence, the mounting device 10 can stop in a short period of time and, further, the throughput of the inspection can be improved. In addition, the elevation body 11 has a uniform weight distribution along the circumferential direction, and is formed with high rigidity. Therefore, an inclination of the mounting table due to a contact pressure generated when the semiconductor wafer and the probes come into contact with each other decreases. Consequently, the inspection can be performed with high reliability.

As set forth above, the mounting device 10 of this embodiment includes: the mounting table for mounting thereon a semiconductor wafer; the cylindrical elevation body 11 having a diameter smaller than that of the mounting table, the cylindrical elevation body 11 supporting the mounting table; the three elevation guide rails 12A provided on the outer peripheral surface of the elevation body 11 so as to be spaced from each other at 120° intervals in the circumferential direction; and support members 13 each having the vertical plate 13A to which the engaging bodies 12B engaged with the elevation guide rails 12A are fixed. Accordingly, the weight of mounting device 10 is reduced and, also, the vertical rigidity of the elevation body 11 is enhanced by the elevation guide rails 12A. Moreover, the support members 13 have a uniform weight distribution along the circumferential direction. Therefore, the mounting device 10 can move at high speed. Further, since the remaining vibration of the mounting device 10 after the high-speed movement is small, the mounting device 10 can stop in a short period of time, thereby improving the throughput of the inspection. Furthermore, even if the probe pressure is applied to any part of the mounting table, it is possible to make a lowering of the mounting table, i.e., the inclination thereof substantially uniform. As a result, the reliability of the inspection can be increased.

In accordance with this embodiment, in addition to the elevation guide rails 12A, the three reinforcing parts 11A are vertically provided on the outer peripheral surface of the elevation body 11 while being spaced from each other at 120° intervals in the circumferential direction, so that the vertical rigidity of the elevation body 11 can be enhanced. Moreover, the reinforcing parts 11A are alternately disposed between the three guide elevation rails 12A and, therefore, the weight of the reinforcing parts 11A can be uniformly distributed along the circumferential direction of the elevation body 11. Accordingly, the mounting table 10 has a weight balance and thus can move smoothly at high speed in the horizontal direction. Furthermore, the mounting table is supported by the protrusions of the three reinforcing parts 11A. Therefore, even if the elevation body 11 is formed to have a diameter considerably smaller than that of the mounting table, the outer edge portion of the mounting table can also be supported by the reinforcing parts 11A and, hence, it is possible to deal with a semiconductor wafer of a large diameter. In addition, since the elevation guide rails 12A and the reinforcing parts 11A are respectively provided at three locations on the outer peripheral surface of the elevation body 11, the elevation body 11 can have enhanced rigidity at a minimum weight, which facilitates the weight reduction of the mounting table 10.

The present invention is not limited to the above embodiment, and the design thereof can be appropriately changed when necessary.

The present invention can be appropriately used in a mounting device moving in a horizontal direction through a stage mechanism.

While the invention has been shown and described with respect to the embodiments, it will be understood by those skilled in the art that various changes and modification may be made without departing from the scope of the invention as defined in the following claims.

What is claimed is:

1. A mounting device provided on a horizontally movable stage mechanism, comprising:
    a mounting table for mounting thereon a target object;
    a cylindrical elevation body, having a diameter smaller than a diameter of the mounting table, for supporting the mounting table;
    a plurality of elevation guide rails provided on an outer peripheral surface of the elevation body so as to be spaced from each other at substantially regular intervals in a circumferential direction; and
    a plurality of support members each having a vertical plate to which engaging bodies engaged with the elevation guide rails are fixed, wherein
    the cylindrical elevation body moves vertically with respect to the support members,
    the mounting table includes a plurality of elevation pins for lifting the target object and holes for allowing the elevation pins to penetrate therethrough, and
    the elevation pins and the holes are disposed at a distance from a center of the mounting table, the distance being greater than the diameter of the cylindrical elevation body.

2. The mounting device of claim 1, wherein a plurality of reinforcing parts are vertically provided on the outer peripheral surface of the elevation body so as to be spaced from each other at substantially regular intervals in the circumferential direction.

3. The mounting device of claim 2, wherein the reinforcing parts are alternately disposed between the elevation guide rails.

4. The mounting device of claim 3, wherein protrusions supporting the mounting table are provided at upper portions of the reinforcing parts.

5. The mounting device of claim 3, wherein the elevation guide rails and the reinforcing parts are provided at three locations on the outer peripheral surface of the elevation body, respectively.

6. The mounting device of claim 2, wherein protrusions supporting the mounting table are provided at upper portions of the reinforcing parts.

7. The mounting device of claim 6, wherein the elevation guide rails and the reinforcing parts are provided at three locations on the outer peripheral surface of the elevation body, respectively.

8. The mounting device of claim 2, wherein the elevation guide rails and the reinforcing parts are provided at three locations on the outer peripheral surface of the elevation body, respectively.

9. The mounting device of claim 1, wherein the vertical plates are provided with upthrust members disposed directly under the elevation pin to lift up the elevation pins.

* * * * *